(12) United States Patent
Davies

(10) Patent No.: US 6,804,801 B2
(45) Date of Patent: Oct. 12, 2004

(54) INTEGRATED CIRCUIT FAULT INSERTION SYSTEM

(75) Inventor: Barry Stanley Davies, Cave Creek, AZ (US)

(73) Assignee: Lucent Technologies Inc., Murray Hill, NJ (US)

( * ) Notice: Subject to any disclaimer, the term of this patent is extended or adjusted under 35 U.S.C. 154(b) by 646 days.

(21) Appl. No.: 09/888,025

(22) Filed: Jun. 25, 2001

(65) Prior Publication Data

US 2002/0199134 A1 Dec. 26, 2002

(51) Int. Cl.[7] .......................... G01R 31/28; G06F 11/00; G06F 17/50
(52) U.S. Cl. ............... 714/724; 714/30; 716/4
(58) Field of Search ................. 714/724, 733, 714/734, 30, 37; 716/1, 4; 703/13, 14

(56) References Cited

U.S. PATENT DOCUMENTS

| | | |
|---|---|---|
| 4,669,081 A | 5/1987 | Mathewes, Jr. et al. |
| 4,875,209 A | 10/1989 | Mathewes, Jr. et al. |
| 5,130,988 A | 7/1992 | Wilcox et al. |
| 5,938,779 A | 8/1999 | Preston |

OTHER PUBLICATIONS

B. Klenke, "Test Technology Overview Module 43," RASSP Program, Pennsylvania State University, Aug. 30, 1998, Slide 85 of 173.

*Primary Examiner*—Guy J. Lamarre
*Assistant Examiner*—C. Britt
(74) *Attorney, Agent, or Firm*—David J. Zwick; Steven R. Santema

(57) ABSTRACT

A system for fault insertion in an integrated circuit that resides in a functional portion of the integrated circuit. The fault insertion system is controlled through a Fault Control Register, comprising a Fault Identification Register (FIR), and a Fault Apply Register (FAR). The FIR is connected to a FIR decode block which, depending on the values contained in the FIR, applies signals to one or more node fault logic blocks. The node fault logic blocks either apply a test signal to a circuit node, or apply the normal system signals to the node. The FAR controls an enable signal to the FIR decode block, and determines when, and the duration, that the test signal will be applied. An External Control Bit of the FAR also allows manual control of the test signal.

3 Claims, 4 Drawing Sheets

FORCE FAIL HIGH

FORCE FAIL LOW

INTEGRATED CIRCUIT FAULT INSERTION SYSTEM

FIELD OF THE INVENTION

The present invention relates to fault insertion in an integrated circuit, and more particularly to fault insertion for the purpose of testing diagnostic software.

BACKGROUND OF THE INVENTION

The traditional goal of circuit level testing is to determine that all components on a printed circuit board assembly (PCBA) are functioning properly. This testing is typically performed at the manufacturing level so as to detect defects at the earliest stage, and is performed while the PCBA is in a non-functional state. The testing is accomplished by applying a set of test input signals at various nodes on the PCBA and reading a resulting set of test output signals. It can be determined if the PCBA components are functioning properly by comparing the actual test output signals with the expected set of test output signals.

For PCBAs having a low level of integration, most nodes of the PCBA are externally accessible, and testing can be accomplished by, for example, a "bed of nails" test jig. As PCBAs become increasingly more complex in their use of integrated circuits and surface mount interconnection technology, more of the nodes and circuits of the PCBA become externally inaccessible, or hidden. In highly integrated circuits, such as field programmable gate arrays (FPGAs), programmable logic devices (PLDs), large scale, very large scale and ultra large scale integration (LSI/VLSI/ULSI), and application specific integrated circuits (ASICs), different designs for testability and testing methodologies are required.

A well known and common manufacturing design technique allowing for easier testing of highly integrated circuits is the "boundary-scan" technique, as described in the Institute of Electrical and Electronic Engineers (IEEE) standards document IEEE Std 1149.1-1990, "IEEE Standard Test Access Port and Boundary Scan Architecture," IEEE, 1993. With the boundary-scan technique, all integrated circuit input and output pins comprise a scan cell in the signal path having a storage device and a switch. In normal operation, the switch connects the integrated circuit pins to the normal functional signals. In a test configuration, certain of the switches connect pins to the storage devices, allowing stored values to be applied to input pins, and the reading of output signals from storage devices connected to output pins. All scan cells are connected to a serial bus that provides for control of all input and output operations of the integrated circuit.

Boundary-scan design can be very effective for hardware testing, but is less so when applied to the testing of a system's diagnostic software. In high availability systems, diagnostic software is a critical system component used to identify problems and, in some cases, to attempt corrective actions. It is very important to be able to test and verify a system's diagnostic software. A common method of testing diagnostic software is to intentionally induce faults in the hardware while the system is in normal operating mode, see that the faults are properly identified by the diagnostic software and, where applicable, appropriate actions are taken. In many systems, it is possible to induce hardware faults through a system backplane by, for example, grounding backplane pins. In highly integrated systems, however, many nodes and circuits are hidden. Another problem with manually inducing faults through the grounding of accessible circuit nodes is that certain interface logic families, for example, the Advanced BiCMOS Technology (ABT) family of devices, have high drive capabilities that can overpower a manually induced short to ground.

SUMMARY OF THE INVENTION

Accordingly, it is an object of the present invention to provide a system to induce faults in highly integrated circuits. A further object of the present invention is to provide a system that is independent of the boundary scan technique. A further object of the present invention is to provide a system that does not require faults be induced through manually grounding or forcing high accessible circuit nodes.

The present invention is a system for fault insertion in an integrated circuit that resides in a functional portion of the integrated circuit. The fault insertion system is microprocessor controlled through a Fault Control Register (FCR). The FCR comprises two registers: a Fault Identification Register (FIR), and a Fault Apply Register (FAR). The FIR is connected to a FIR decode block which, depending on the values contained in the FIR, applies signals to one or more node fault logic blocks connected to nodes of the integrated circuit. The node fault logic blocks either apply a test signal to a circuit node, or apply the normal system signals to the node. The FAR controls an enable signal to the FIR decode block, and determines when, and the duration, that the test signal will be applied. An External Control Bit of the FAR also allows manual control of the test signal.

DESCRIPTION OF THE PREFERRED EMBODIMENT

Figure 1:
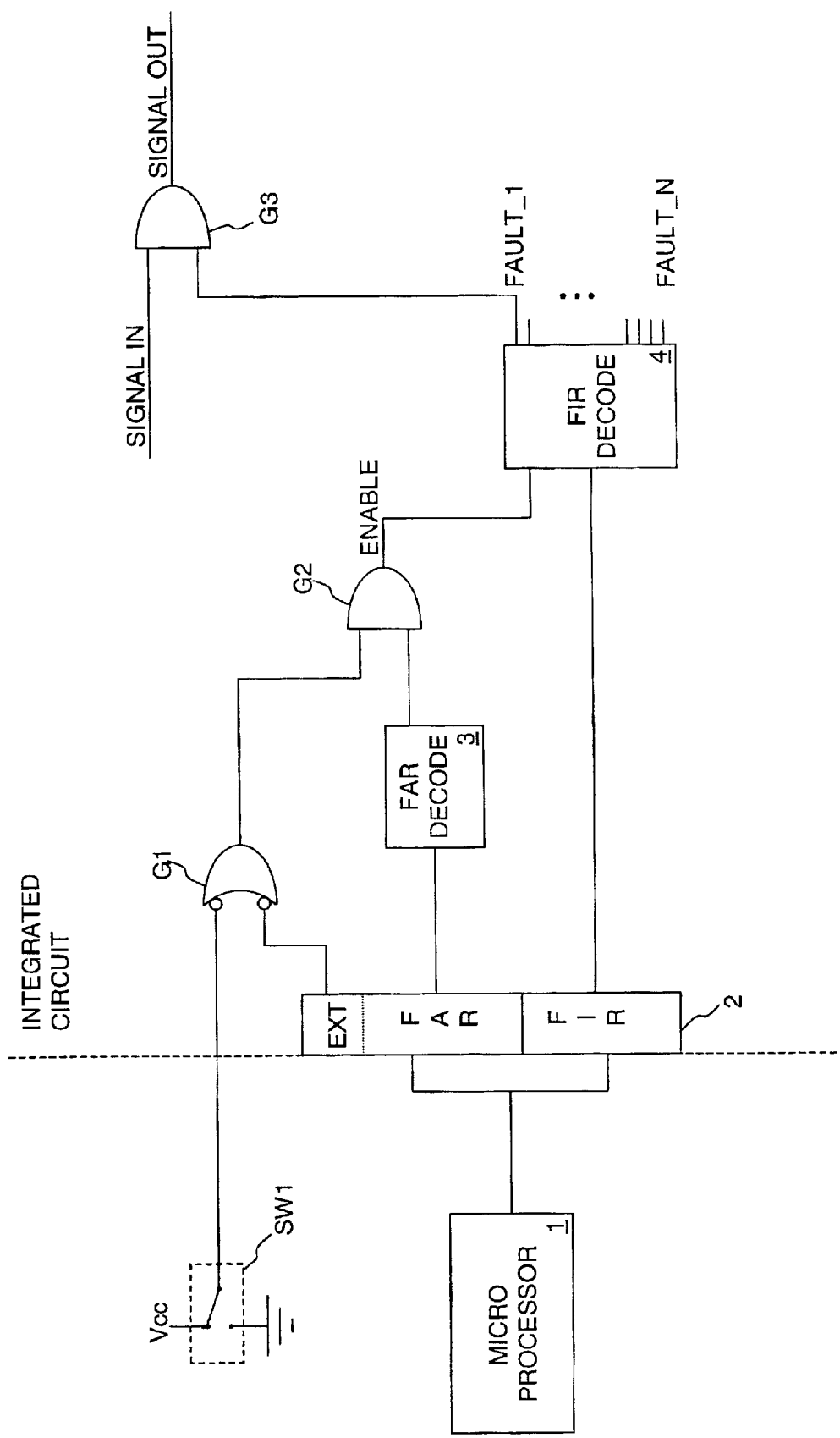
FIG. 1 shows a block diagram of a preferred embodiment of the present invention.

FIG. 1 shows a block diagram of a preferred embodiment of the present invention. All residing in the functional portion of an integrated circuit, Fault Control Register (FCR) 2 is comprised of a Fault Identification Register (FIR), and a Fault Apply Register (FAR) that includes an External Control Bit (EXT). The FIR is connected to FIR decode block 4. FIR decode block 4 has output signals FAULT_1 to FAULT_N, which are connected to integrated circuit node fault logic blocks. By way of illustration, one such node fault logic block is shown, and comprises signal FAULT_1 connected to one input of AND gate G3, normal system signal SIGNAL IN connected to the other input of AND gate G3, and AND gate G3 output signal SIGNAL OUT. Each of signals FAULT_1 through FAULT_N is connected to a node fault logic block, and each node fault logic block comprises one or more of signals FAULT_1 through FAULT_N. The FAR is connected to FAR decode block 3, which has an output connected to one input of AND gate G2. Output signal ENABLE of AND gate G2 is connected to FIR decode block 4. Bit EXT is connected to an inverted input of OR gate G1. The output of OR gate G1 is connected to the other input of AND gate G2.

External microprocessor 1 is connected to the FIR and FAR of FCR 2. An external manual switch SW1 is connected to the other inverted input of OR gate G1. Switch SW1 is normally in a first position and applies Vcc, or can be momentarily switched to a second position to apply a ground signal.

In operation of the embodiment illustrated in FIG. 1, microprocessor 1 loads one of a set of predetermined Fault Identification Code (FIC) values into the FIR of FCR 2. FIR decode block 4 decodes the FIC, which will result in signal FAULT_1 being asserted low while signal ENABLE is asserted to FIR decode block 4. In general, each of the set of predetermined FIC values results in FIR decode block 4 asserting an output signal comprising a combination of signals FAULT_1 to FAULT_N while signal ENABLE is asserted.

Signal ENABLE is asserted in one of two ways. In the automatic method of asserting signal ENABLE, switch SW1 is in its normal first position connected to Vcc, and bit EXT of the FAR is not set by microprocessor 1, resulting in OR gate G1 asserting its output to one of the inputs of AND gate G2. Microprocessor 1 then loads the predetermined fault-on Fault Apply Code (FAC) value into the FAR of FCR 2. FAR decode block 3 decodes the FAC, which results in the FAR decode block 3 output signal being asserted on the other input of AND gate G2, which further results in AND gate G2 output signal ENABLE being asserted to FIR decode block 4, which further results in signal FAULT_1 being asserted low. As illustrated in FIG. 1, the node fault logic block that controls the node connected to AND gate G3 is an example of a force fail low node fault block. When signal FAULT_1 is asserted low, signal SIGNAL OUT remains low regardless of the value of normal system signal SIGNAL IN. When microprocessor 1 loads the predetermined fault-off FAC value into the FAR of FCR 2, FAR decode block 3 decodes the FAC, which results in the FAR decode block 3 output signal being deasserted on the other input of AND gate G2, which further results in AND gate G2 output signal ENABLE being deasserted to FIR decode block 4, which further results in signal FAULT_1 being deasserted high. With signal FAULT_1 being deasserted high, SIGNAL OUT will have the same value as normal system signal SIGNAL IN.

In the manual method of asserting signal ENABLE, bit EXT of the FAR is set by microprocessor 1, resulting in OR gate G1 deasserting its output to one of the inputs of AND gate G2. Microprocessor 1 then loads the predetermined fault-on Fault Apply Code (FAC) value into the FAR of FCR 2. FAR decode block 3 decodes the FAC, which results in the FAR decode block 3 output signal being asserted on the other input of AND gate G2. When, for example, a tester momentarily moves switch SW1 to its second ground position, the output signal of OR gate G1 is asserted at AND gate G2, which further results in AND gate G2 output signal ENABLE being asserted to FIR decode block 4, which further results in signal FAULT_1 being asserted low. When switch SW1 is moved to its normal first Vcc position, the output signal of OR gate G1 is deasserted at AND gate G2, which results in AND gate G2 output signal ENABLE being deasserted to FIR decode block 4, which further results in signal FAULT_1 being deasserted high.

Figure 3:
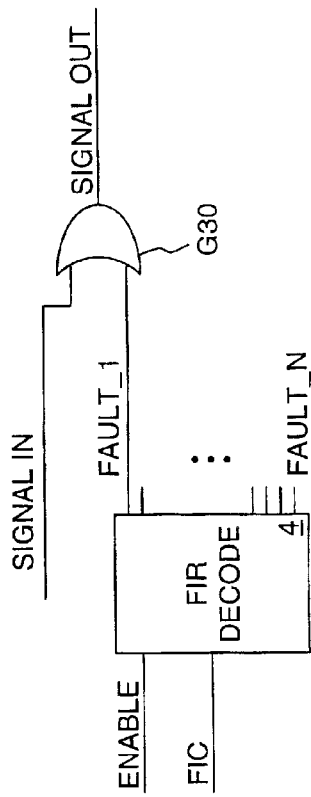
FIG. 3 shows a block diagram of an embodiment of a force fail high node fault logic block.
Figure 2:
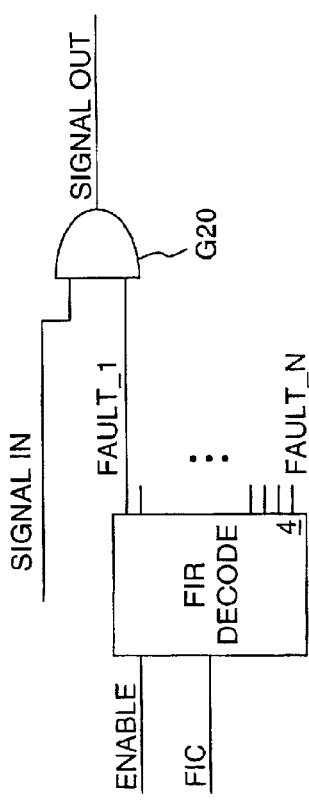
FIG. 2 shows a block diagram of an embodiment of a force fail low node fault logic block.
Figure 4A:
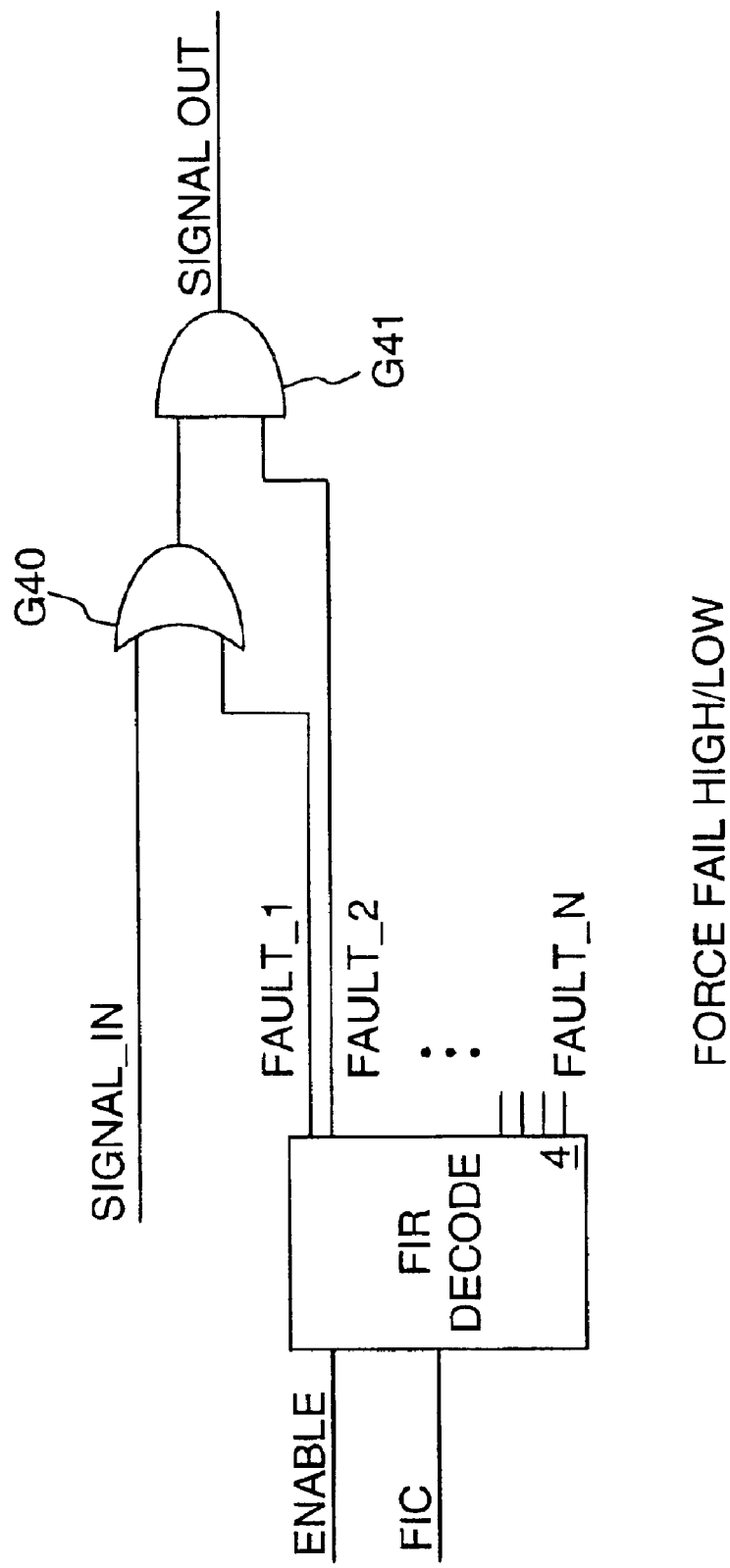
FIG. 4A shows a block diagram of a first embodiment of a force fail high/low node fault logic block.
Figure 4B:
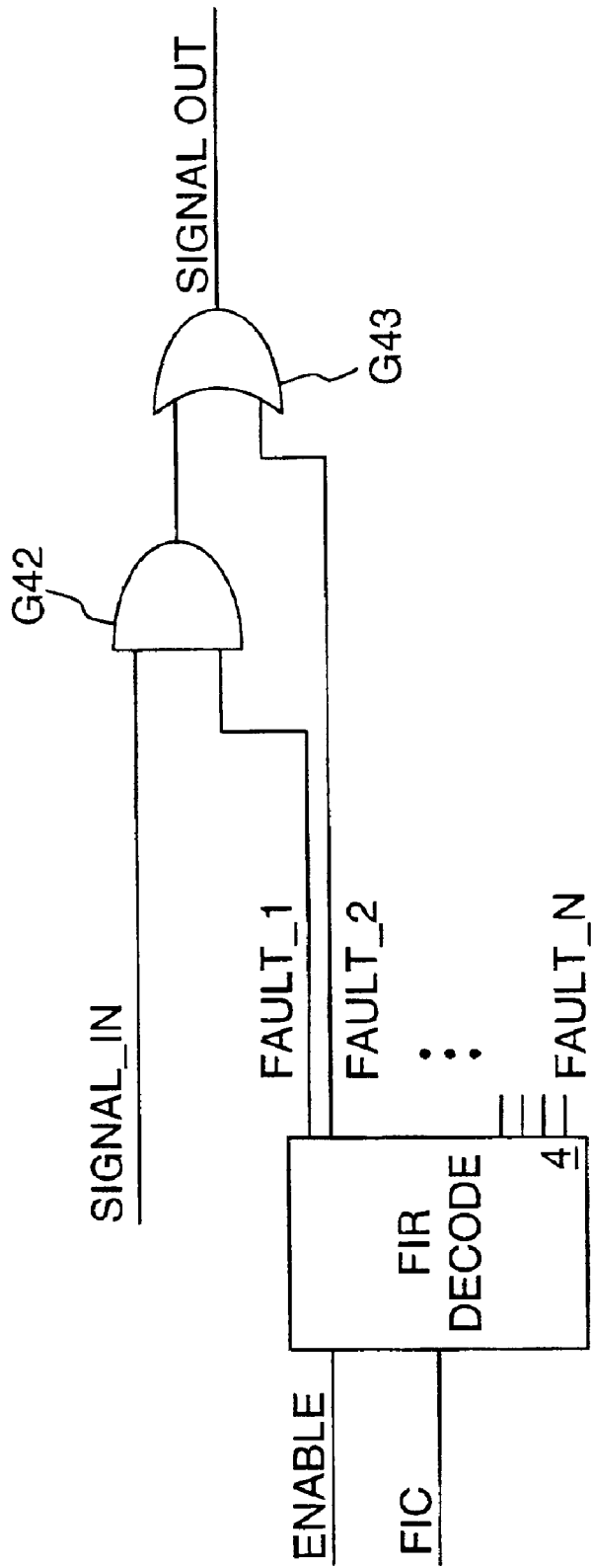
FIG. 4B shows a block diagram of a second embodiment of a force fail high/low node fault logic block.

FIGS. 2, 3, 4A and 4B show examples of node fault logic blocks. FIG. 2 shows an example of a force fail low, or stuck-at-zero, node fault logic block. When FIR decode block 4 output signal FAULT_1 is deasserted high, AND gate G20 output signal SIGNAL OUT follows normal system signal SIGNAL IN. When signal FAULT_1 is asserted low, signal SIGNAL OUT remains low regardless of the value of system signal SIGNAL IN. FIG. 3 shows an example of a force fail high, or stuck-at-one, node fault logic block. When signal FAULT_1 is deasserted low, OR gate G30 output signal SIGNAL OUT follows normal system signal SIGNAL IN. When signal FAULT_1 is asserted high, signal SIGNAL OUT remains high regardless of the value of system signal SIGNAL IN. FIG. 4A shows a first example of a force fail high or low node fault logic block. In this circuit, fault insertion is controlled by two output signals from FIR decode block 4. When signal FAULT_1 is deasserted low and signal FAULT_2 is deasserted high, signal SIGNAL OUT follows system signal SIGNAL IN. When signal FAULT_1 is asserted high and signal FAULT_2 is deasserted high, signal SIGNAL OUT remains high regardless of the value of signal SIGNAL IN. When signal FAULT_2 is asserted low, signal SIGNAL OUT remains low regardless of the value of signal SIGNAL IN. FIG. 4B shows a second example of a force fail high or low node fault logic block. When signal FAULT_1 is deasserted high and signal FAULT_2 is deasserted low, signal SIGNAL OUT follows system signal SIGNAL IN. When signal FAULT_1 is asserted low, signal SIGNAL OUT follows signal FAULT_2.

In the present invention, microprocessor 1 can be programmed to induce permanent faults, transient faults and intermittent faults through fault assertion codes applied to the FAR of FCR 2. As disclosed above, a tester may also control fault assertion through switch SW1.

In the node fault logic block examples above, each example is presented as the application of a fault, or test signal, to a single node. FIR decode block 4 can be programmed to apply multiple faults, based on the FIC applied to the FIR of FCR 2, through the application of a combination of signals FAULT_1 through FAULT_N to multiple node fault logic blocks, when signal ENABLE is asserted.

While the node fault logic block examples above illustrate stuck-at type faults, persons having skill in the art can easily program other fault types, such as stuck-open and bridging faults, into the integrated circuit.

While a preferred embodiment of the fault insertion system invention of Applicant has been particularly shown and described, it is not intended to be exhaustive nor limit the invention to the embodiment disclosed. It will be apparent to those of ordinary skill in the art that modifications to the preferred embodiment can be made without departing from the scope and spirit of the invention. It is intended that the scope of the invention be defined by the claims appended hereto and their equivalents.

What is claimed is:

1. A fault insertion system resident in an integrated circuit, said fault insertion system having a source for an external assert signal and a source for register values, said integrated circuit having one or more circuit nodes receiving normal system signals, said fault insertion system comprising:

a Fault Apply Register (FAR) operated to receive FAR codes from said source for register values, said FAR codes having values associated with a fault-on code and a fault-off code;

a FAR decode block connected to said FAR and operated to decode said FAR codes and assert a FAR decode block output signal when said FAR contains said fault-on code, and to deassert said FAR decode block output signal when said FAR contains said fault-off code;

an External Control Bit (EXT) operated to receive EXT values from said source for register values, said EXT values associated with set or not set;

a first logic connected to said EXT and said external assert signal, and operated to assert a first logic output signal when said EXT contains said not set value or when said EXT contains said set value and said external assert signal is asserted;

a second logic connected to said FAR decode block output signal and said first logic output signal, and operated to assert a second logic output signal when said FAR decode block output signal is asserted and said first logic output signal is asserted;

a Fault Identification Register (FIR) operated to receive a FIR code from said source for register values, said FIR code being one of a set of FIR codes, each of said FIR codes having a value associated with a desired fault;

a FIR decode block connected to said FIR and said second logic output signal, and operated to decode said FIR code and assert a FIR decode block output signal while said second logic output signal is asserted; and a circuit node fault logic block connected to said FIR decode block output signal and one of said circuit nodes, and operated to apply said normal system signals to said circuit node when said FIR decode block output signal is not asserted, and to apply a test signal to said circuit node while said FIR decode block output signal is asserted.

2. A fault insertion system according to claim 1, wherein said FIR decode block output signal comprises a plurality of fault signals, and said fault insertion system further comprises a plurality of node fault logic blocks, each of said node fault logic blocks connected to one or more of said fault signals and one of said circuit nodes.

3. A fault insertion system according to claim 1, wherein said source for register values comprises a microprocessor.

* * * * *